(12) United States Patent
Ramorini et al.

(10) Patent No.: US 10,797,688 B2
(45) Date of Patent: Oct. 6, 2020

(54) COMPARATOR CIRCUIT, CORRESPONDING DEVICE AND METHOD

(71) Applicant: STMicroelectronics S.r.l., Agrate Brianza (IT)

(72) Inventors: Stefano Ramorini, Arluno (IT); Germano Nicollini, Piacenza (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/043,346

(22) Filed: Jul. 24, 2018

(65) Prior Publication Data

US 2019/0036518 A1   Jan. 31, 2019

(30) Foreign Application Priority Data

Jul. 25, 2017   (IT) .................... 102017000084511

(51) Int. Cl.
   *H03K 5/24*    (2006.01)
   *G01R 19/00*   (2006.01)
   *H03K 3/023*   (2006.01)
   *G01R 19/165*  (2006.01)

(52) U.S. Cl.
   CPC ....... *H03K 5/2481* (2013.01); *G01R 19/0038* (2013.01); *H03K 3/023* (2013.01); *G01R 19/16519* (2013.01)

(58) Field of Classification Search
   CPC .................................................. H03K 5/2481
   See application file for complete search history.

(56) References Cited

U.S. PATENT DOCUMENTS

| 8,575,977 | B1 * | 11/2013 | Philpott ............... H03K 5/2481 |
| | | | 327/143 |
| 2008/0002481 | A1 * | 1/2008 | Gogl .......................... G11C 5/02 |
| | | | 365/189.06 |
| 2008/0084232 | A1 * | 4/2008 | Huang ................. H03K 5/1536 |
| | | | 327/77 |
| 2016/0079944 | A1 | 3/2016 | Schaffer et al. |

FOREIGN PATENT DOCUMENTS

| CN | 204089754 U | 1/2015 |
| EP | 3035530 A1 | 6/2016 |

OTHER PUBLICATIONS

IT Search Report and Written Opinion for IT Appl. No. 102017000084511 dated Mar. 15, 2018 (8 pages).

* cited by examiner

*Primary Examiner* — Lincoln D Donovan
*Assistant Examiner* — Colleen J O Toole
(74) *Attorney, Agent, or Firm* — Crowe & Dunlevy (57) ABSTRACT

A comparator circuit is implemented using a simple comparator core having two gain stages integrated in a single circuit block. The circuit operates with improved speed and resolution in comparison to a conventional continuous-time comparator. Offset trimming allows for the crossing time of the comparator to be adjusted close to an ideal crossing time.

37 Claims, 4 Drawing Sheets

COMPARATOR CIRCUIT, CORRESPONDING DEVICE AND METHOD

PRIORITY CLAIM

This application claims the priority benefit of Italian Application for Patent No. 102017000084511, filed on Jul. 25, 2017, the content of which is hereby incorporated by reference in its entirety to the maximum extent allowable by law.

TECHNICAL FIELD

The description relates to comparator circuits.

One or more embodiments may refer to high-speed comparator circuits for use in a wide variety of electronic devices. A DC-DC converter for use, for example, in driving display screens is exemplary of such a device.

BACKGROUND

Comparator circuits may be used for detecting the crossing point between two signals, for example an input signal and a reference signal.

The difference between the two signals being compared may be very small (about few mV or less). Comparator circuits including at least two stages may thus be used to facilitate good resolution. Avoiding current limitations in such stages facilitates providing high-speed comparators; however, this may result in undesirably high power consumption.

Despite the extensive activity in that area, further improved comparator circuits are desirable. There is a need in the art to provide such an improved solution.

SUMMARY

One or more embodiments relate to a comparator circuit having the features set forth in the claims that follow. A DC-DC converter for use, for example, in driving a display screen such as an active matrix organic light emitting diode (AMOLED) screen is exemplary of a device which may use the comparator circuit.

In an embodiment, a two-stage signal-triggered continuous-time comparator is provided, wherein current in a first stage is not limited and two gain stages are integrated in a single circuit block.

In one or more embodiments, the possibility for a delay to be generated due to the high sensitivity of the circuit (which may result in an error and thus in a shift of the real crossing time with respect to an ideal crossing time) can be dealt with by providing a trimmable time offset able to compensate for this delay.

In one or more embodiments such an offset may lead to a sort of anticipated artificial crossing time suited to compensate for the comparator delay. This facilitates moving the real crossing time close to an ideal one.

One or more embodiments may take into account the possible dependency of the delay on the slope of the input signal. In one or more embodiments, the amount of offset can be calibrated in order to avoid that the real crossing time may undesirable anticipate an ideal crossing time.

One or more embodiments may provide one or more of the following advantages:
- a simple comparator core, with two gain stages integrated in a single circuit block;
- improved speed and resolution over conventional continuous-time comparators;
- crossing time brought (very) close to an ideal crossing time thanks to offset trimming, thus improving performance; and
- offsets trim implementation made simple, for example with only two modular switches.

In an embodiment, a circuit comprises: a supply line; a first current path including a first current generator and a first transistor, the first current generator active between the supply line and a first node and the first transistor arranged with the current path therethrough extending between the first node and a reference node configured for receiving a reference signal; a second current path including a second current generator and a second transistor, the second current generator active between the supply line and a second node and the second transistor arranged with the current path therethrough extending between the second node and an input node configured for receiving an input signal, the first transistor and the second transistor having control terminals coupled at a third node with a third current generator active on the third node; a third current path between the supply line and the third node, the third current path including a third transistor having a control terminal coupled with the first node; a fourth current path between the supply line and the third node, the fourth current path including a fourth transistor having a control terminal coupled with the second node; and an output node coupled to the current path of the fourth transistor opposite the third node, wherein the signal at the output node is switchable between a first and a second state as a result of the input signal at the input node crossing the level of the reference signal at the reference node.

The first transistor and the second transistor may be implemented as modular transistors with the second transistor including a number N of active modules different from, optionally smaller than, a number K of active modules in the first transistor.

In an embodiment, a first transistor-implemented switch may be connected between the first transistor and the reference node, and a second transistor-implemented switch may be connected between the second transistor and the input node. The first transistor-implemented switch and the second transistor-implemented switch may include modular transistors with the second transistor-implemented switch including a number N of active modules different from, optionally smaller than, a number K of active modules in the first transistor-implemented switch.

The second transistor-implemented switch may include a control terminal coupled to an enable input configured for enabling operation of the circuit.

A reference transistor may be provided with its current path extending between the reference node and a common node of the second transistor and the second transistor-implemented switch with the control terminal of the second transistor-implemented switch coupled via a logical inverter with the control terminal of the reference transistor.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
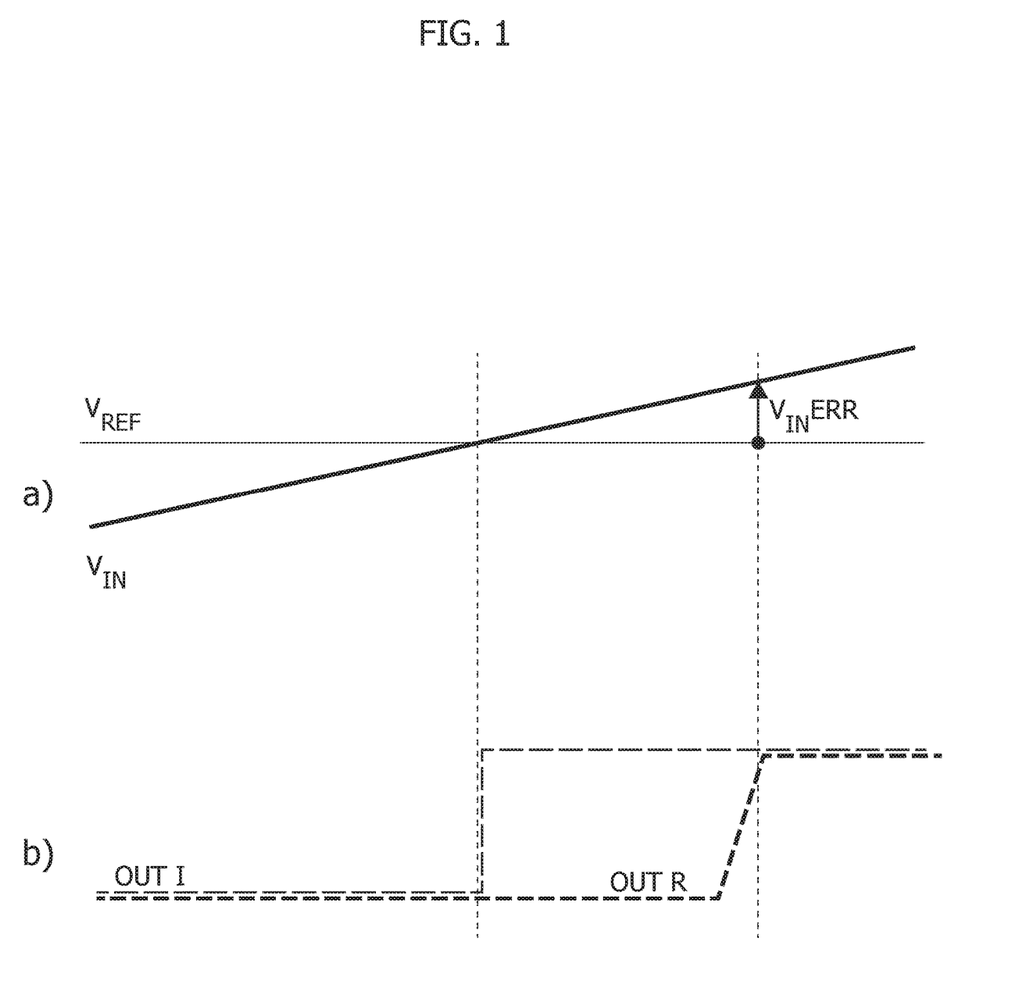
FIG. 1, including two portions designated a) and b), respectively, includes time diagrams exemplary of operation of a comparator circuit, FIG. 2, again including two portions designated a) and b), respectively, includes a circuit diagram—portion a)—and a block diagram—portion b)—of a comparator circuit.

FIG. 1 is exemplary of possible operation of a comparator circuit.

A comparator circuit can be used for detecting the crossing point of two signals, for example an input signal $V_{IN}$ and a reference signal $V_{REF}$.

For that purpose, a comparator circuit can be operated continuously, in order to continuously monitor the input signal, without any clocking scheme applied to the comparator circuit. If, for example at a system level, a time window is (at least approximately) known where the crossing may occur, the possibility exists of powering down (that is turning-off) the comparator circuit in order to save power. The comparator circuit can thus be activated (only) during the time window where crossing is expected to occur. The possibility also exists of short-circuiting the inputs to the comparator circuit in order to increase its speed during crossing point evaluation.

In various applications, the difference between the two signals $V_{IN}$, $V_{REF}$ to be compared may be (very) small: for instance, it may lie in the range of a few mV or less.

In principle, a comparator should switch just immediately after the crossing point (see, for example, the ideal step-like waveform designated OUT I in portion b) of FIG. 1).

In practical implementations, however, a delay may occur, as exemplified by the real waveform indicated OUT R in portion b) of FIG. 1. Such a delay in switching may be hardly acceptable in various applications in so far as this may result in an error on $V_{IN}$, as indicated by $V_{IN}$ ERR in portion a) of FIG. 1.

Figure 2:
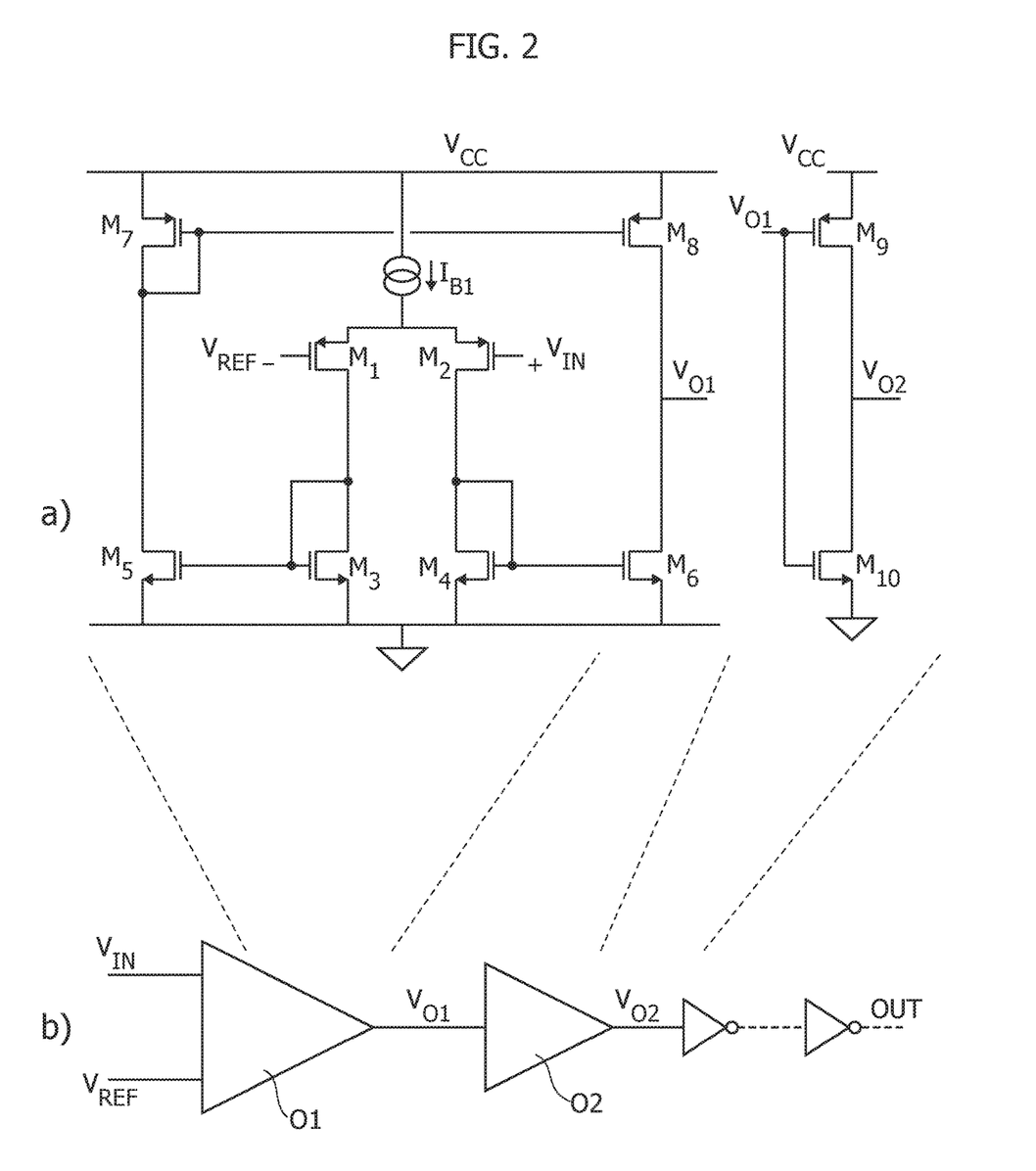

Such an undesirable behavior may occur also in comparator circuits as exemplified in FIG. 2, including two gain stages for good resolution. As exemplified in FIG. 2, a two-stage comparator can be implemented by resorting to two cascaded Operational Transconductance Amplifiers (OTAs), namely O1 and O2, in an open-loop configuration.

It was noted that, in such a two-stage arrangement, a delay as portrayed in the lower portion of FIG. 1 may be related to the slope of the output signal from the first stage O1, which is limited by its finite "tail" current $I_{B1}$.

This drawback can be attempted to be addressed by increasing the slope, for example by providing a large tail current, which in turn may increase power consumption undesirably.

This drawback can in turn be addressed, at least partially, by resorting to dynamically biased input stages, where the tail current increases with the level of the input signal difference. Resorting to such an approach may result in fairly complex implementations, while an undesired delay may still be noted for (very) low signal differences.

Figure 3:
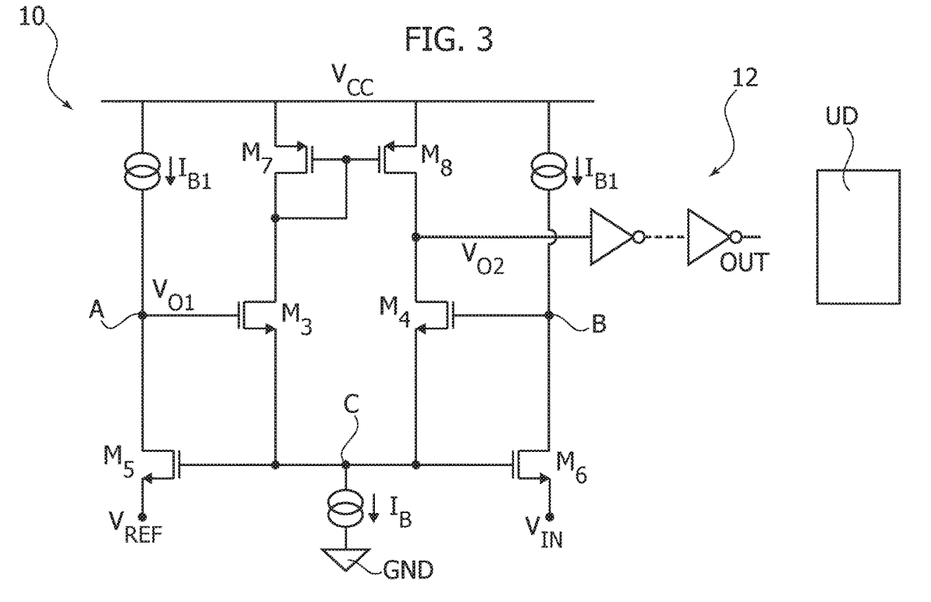
FIG. 3 is a circuit diagram exemplary of embodiments.

One or more embodiments may corresponded to the circuit layout exemplified in FIG. 3.

The circuit in question, designated 10 as a whole, may include a supply line (node) to be brought to a voltage $V_{CC}$. The circuit 10 can thus operate between $V_{CC}$ and ground GND and include two current generators $I_{B1}$ active between the supply line at the voltage $V_{CC}$ and intermediate nodes designated A and B, respectively.

In the exemplary arrangement shown in FIG. 3, a first transistor (for example a MOSFET transistor) M5 is arranged with its (source-drain) current path or channel between the node A and a reference node designated $V_{REF}$.

Also, a second transistor (for example a MOSFET transistor) M6 is arranged with its (source-drain) current path or channel between the node B and an input node $V_{IN}$.

Two circuit branches each including a sort of "totem-pole" arrangement of two transistors (for example MOSFET transistors) M3, M7 and M4, M8, respectively are arranged between the supply line at voltage $V_{CC}$ and a node C at which a "tail" current generator $I_B$ is active with the generator $I_B$ set between the node C and ground GND. The two transistors in each branch, namely M3, M7 and M4, M8 are arranged with their (source-drain) current paths or channels cascaded in series to each other.

The gate terminals of transistor M7 and M8 are coupled to each other at a common point which is shorted to the current path (for example the drain terminal) of the transistor M7 to form a current mirror circuit.

The gate of transistor M3 is coupled to the node A (at which a voltage $V_{O1}$ is present) and the gate terminal of transistor M4 is coupled to the node B.

A common point between the transistors M4 and M8 (for example the commonly-coupled drains of these two transistors) provides an output voltage $V_{O2}$ towards an output stage 12 (including for example inverter stages) to provide an output signal at an output node OUT towards a user device UD (for example a DC-DC converter as discussed previously).

By way of explanation of possible operation of the circuit 10 of FIG. 3 one may consider the case where $V_{IN}$ is (slightly) higher than $V_{REF}$: for simplicity, a same designation will be used hereinafter for the nodes $V_{IN}$, $V_{REF}$ and the (voltage) signals applied thereto.

Since the current flowing into transistor M6 is fixed by the right-hand current generator $I_{B1}$ in FIG. 3, also the gate-source voltage $V_{GS}$ of M6 will be fixed. Thus the gate of transistor M6 will follow the behavior of $V_{IN}$ by increasing the $V_{GS}$ voltage of transistor M5.

This will translate into an increase of the current flowing through the transistor M5 which will become higher than the current intensity provided by the left-hand current generator $I_{B1}$ in FIG. 3. This will in turn lead to a (large) decrease the voltage at the drain terminal of transistor M5 and the gate terminal of M3.

This arrangement can be considered as a sort of a first stage of amplification where the current is not limited, thus increasing the slope at node A ($V_{O1}$).

Since the voltage at the gate of transistor M3 is (much) lower than the voltage at the gate of transistor M4, most of the ("tail") current $I_B$ will flow through the transistor M4 by decreasing the voltage at the drain of the transistor M4.

This can be considered as a sort of second stage of amplification capable of driving the node B ($V_{O2}$) and then producing a switching of the output node OUT.

A circuit as exemplified in FIG. 3 will thus exhibit improved resolution and speed in comparison with conventional continuous-time comparators.

Figure 4:
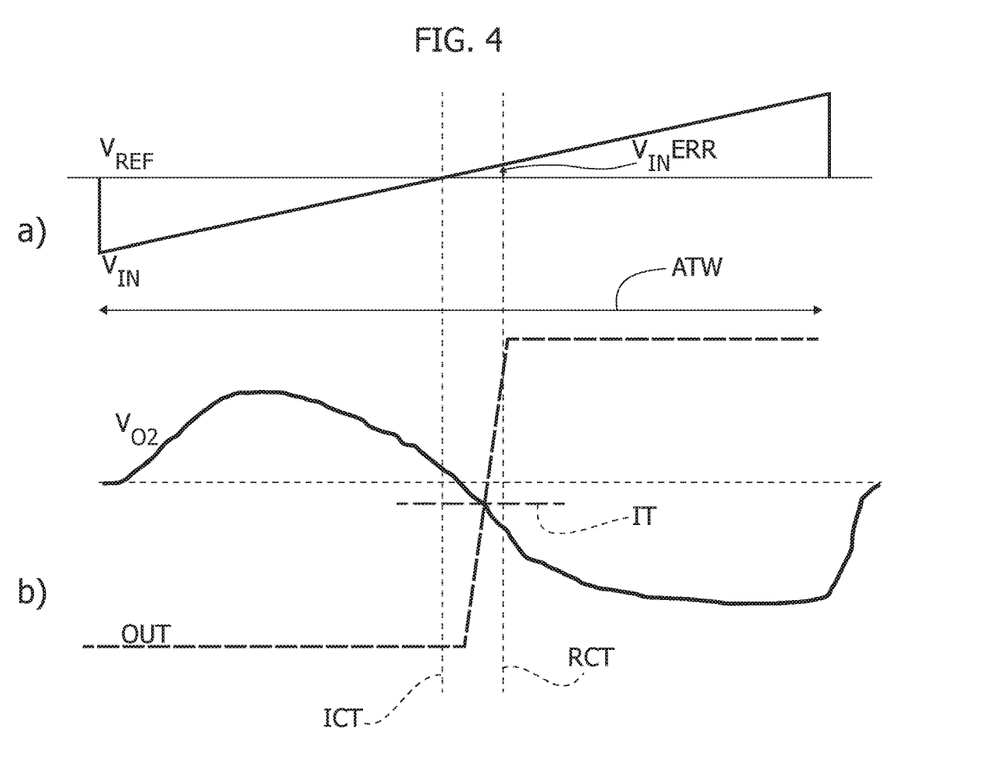
FIG. 4 includes two portions, designated a) and b), respectively, exemplary of possible operation of one or more embodiments.

The diagrams of FIG. 4 are exemplary of possible operation of the circuit layout as exemplified in FIG. 3.

In FIG. 4 one may thus observe that when $V_{IN}$ is lower than $V_{REF}$ the node $V_{O2}$ may exhibit a large voltage excursion (hundreds of mV).

This voltage excursion can be related to the high sensitivity of the circuit and may translate into a delay of the "real" crossing time of the circuit 10 with respect to an "ideal" crossing time. In FIG. 4, these crossing times are indicated as RCT and ICT, respectively, with IT indicating a possible setting the threshold of the output inverter stage 12, to which the signal $V_{O2}$ is fed.

Such a delay may be (by way of non-limiting example) in the range of a few tens of ns (1 ns=1×10$^{-9}$). This may produce an error in $V_{IN}$ which is small if the slope of $V_{IN}$ is low and may become larger if the slope of $V_{IN}$ is high.

While in certain applications these errors may be acceptable, this may not be the case in other applications, for example depending on the characteristics of user device UD coupled to the output node OUT.

Figure 5:
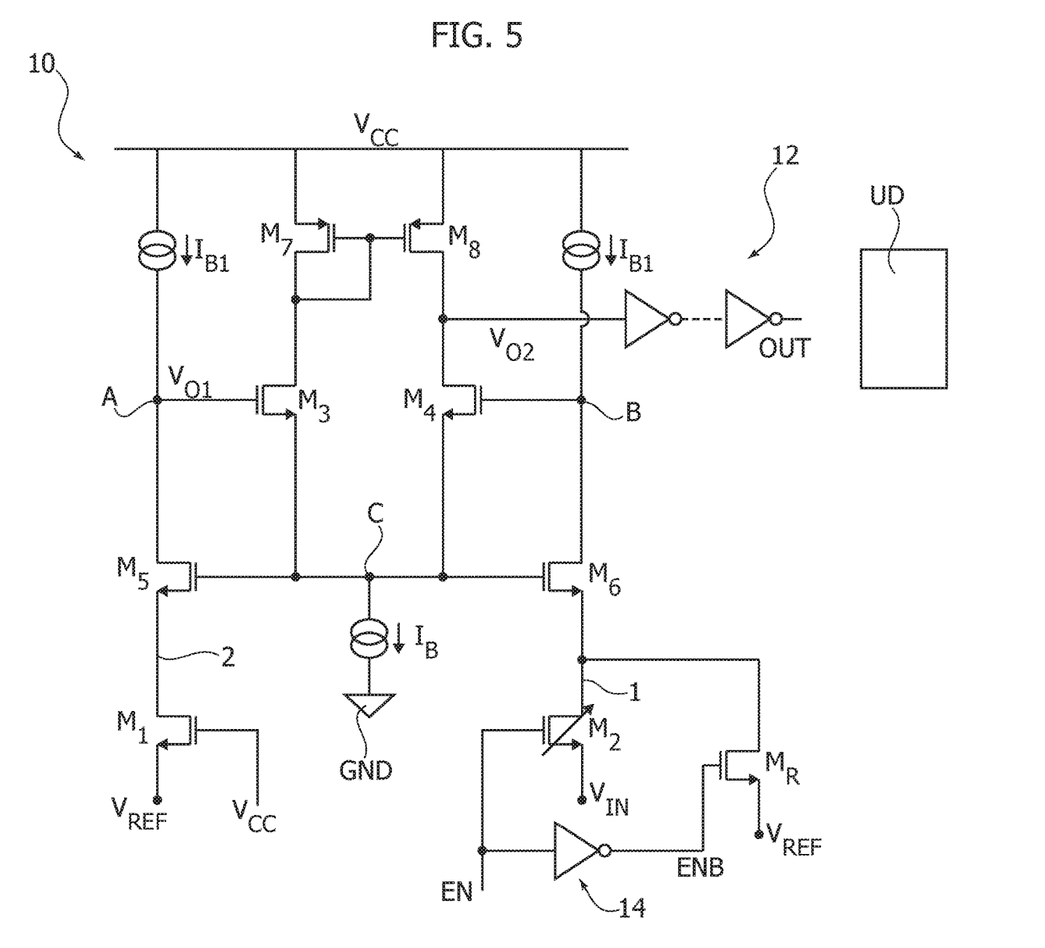
FIG. 5 is a further circuit diagram exemplary of one or more embodiments.

In one or more embodiments, that issue can be addressed by resorting to the circuit arrangement exemplified in FIG. 5.

In FIG. 5 parts or elements like parts or elements already discussed in connection with FIG. 3 and the previous figures) are indicated by like references/numerals; a corresponding detailed description will not be repeated here for brevity.

A circuit arrangement as exemplified in FIG. 5 is intended to introduce an offset that leads to an anticipated "artificial" crossing time aiming at compensating the comparator delay thus moving the real crossing time RCT closer to the ideal crossing time ICT.

As noted, the comparator delay is somehow related to the slope of the signal $V_{IN}$. One or more embodiments may thus contemplate calibrating the offset in order to avoid for example that the real crossing time RCT may undesirably anticipate the ideal crossing time ICT, which may not be acceptable in certain applications.

A way of creating an offset as indicated above in a circuit layout as exemplified in FIG. 3 may involve acting on a difference between the transistors M5 and M6, for example by implementing the transistors M5 and M6 with a plurality of modules, say K modules. A desired offset can thus be achieved, for example, by selecting (activating) a different number of modules in M5 and M6, for example (only) N modules out of K in transistor M6, with N<K.

Selecting for K, and in turn N, (very) large values may facilitate a fine offset trimming in so far as M5 and M6 are the input transistors of the comparator.

While this embodiment is feasible, practical implementation considerations may suggest that both M5 and M6 are implemented as relatively small transistors (W/L<1). This is hardly compatible with splitting them in a large number of modules.

In one or more arrangements as exemplified in FIG. 5 two transistors (for example MOSFET transistors) M1, M2 are set between the transistor M5 and the reference node $V_{REF}$ and the transistor M6 and the input node $V_{IN}$, respectively.

As exemplified in FIG. 5, both transistors M1 and M2 are arranged with their (source-drain) current paths or channels cascaded in series with the current paths or channels of the transistors M5 and M6.

The gate terminal of transistor M1 is coupled to a supply node at the voltage $V_{CC}$ and thus is configured is a closed operational state when power supply is present.

The gate terminal of transistor M2 is in turn coupled with an enable node EN and thus is configured in a closed operational state when EN is asserted (and open operational state when EN is deasserted), with a logical inverter 14 providing a logically inverted version of the enable signal EN, namely ENB, to the gate of a further transistor (for example MOSFET transistor) MR which is thus configured in an open operational state when EN is asserted (and closed operational state when EN is deasserted).

The transistor MR is arranged with its (source-drain) current path or channel between an intermediate node, designated node 1, between the transistor M6 and the transistor M2 and a reference node brought at the reference voltage $V_{REF}$. A homologous intermediate node between the transistor M5 and the transistor M1 will hereinafter be referred to as node 2.

An arrangement as exemplified in FIG. 5 creates a desired offset as indicated above by providing three transistors (namely M1, M2 and MR) such as, for example, MOSFET transistors operating in the triode region, that is acting as switches with controlled open/closed operational states, with the enable signal EN defining the active time window of the comparator circuit.

When EN=0, the node 1 is connected to the reference node $V_{REF}$ through the transistor MR performing a sort of reset action of the comparator.

If desired, the complementary enable signal ENB can also be used to power down the entire comparator 10.

When EN=1, the node 1 is connected to the input node $V_{IN}$ through the transistor M2 so that the crossing time between $V_{IN}$ and $V_{REF}$ can be detected readily.

With transistors M1 and M2 working as switches, implementation as K modules in parallel is facilitated.

Moreover, fine offset trimming is facilitated even if the value of K is not large in so far as the effect of the transistors M1 and M2 is minor with respect to the effect of the transistors M5 and M6.

As a consequence, offset trimming can be facilitated by selecting (activating) a different number of modules in M1 and M2, for example (only) N modules over K modules in transistor M2, with N<K.

In one or more embodiments a lookup table can be used to read the offset value for use by the comparator circuit 10 and consequently to apply it through the selection of, for example, units are on the transistor M2. This action can be facilitated by the system including the circuit 10 being expectedly able to provide information about the slope of the input signal $V_{IN}$ in addition to the length of the timing window.

In one or more embodiments the real crossing time RCT in FIG. 4 can be brought very close to an ideal crossing time ICT for a wide range of possible slopes of $V_{IN}$, thus correspondingly reducing the error $V_{IN}$ ERR.

A circuit (for example 10) according to one or more embodiments may include:
- a supply line (or node, for example $V_{CC}$),
- a first current path including a first current generator (for example $I_{B1}$) and a first transistor (for example M5), the first current generator active between the supply line and a first node (for example A) and the first transistor arranged with the current path therethrough (for example source-drain, in a field-effect transistor such as a MOSFET) extending between the first node and a reference node configured for receiving a reference signal (for example $V_{REF}$),
- a second current path including a second current generator (for example $I_{B1}$) and a second transistor (for example M6), the second current generator active between the supply line and a second node (for example B) and the second transistor arranged with the current path therethrough extending between the second node (for example B) and an input node configured for receiving an input signal (for example $V_{IN}$), the first transistor and the second transistor having control terminals (for example gate in a field-effect transistor such as a MOSFET) coupled at a third node (for example C) with a third current generator (for example $I_B$) active on the third node,
- a third current path between the supply line and the third node, the third current path including a third transistor (for example M3) having a control terminal coupled with the first node,
- a fourth current path between the supply line and the third node, the fourth current path including a fourth transistor (for example M4) having a control terminal coupled with the second node, and
- an output node (for example 12, OUT) coupled to the current path (for example drain) of the fourth transistor opposite the third node, wherein the signal at the output node is switchable between a first and a second state as a result of the input signal ($V_{IN}$) at the input node crossing the level of the reference signal ($V_{REF}$) at the reference node.

In one or more embodiments the first transistor and the second transistor may include modular transistors with the second transistor including a number N of active modules different from, optionally smaller than, the number K of modules in the first transistor.

One or more embodiments may include:
- a first transistor-implemented switch (for example M1) between the first transistor and the reference node,
- a second transistor-implemented switch (for example M2) between the second transistor and the input node,
- the first transistor-implemented switch and the second transistor-implemented switch including modular transistors with the second transistor-implemented switch including a number N of active modules different from, optionally smaller than, the number K of modules in the first transistor-implemented switch.

In one or more embodiments:
- the first transistor-implemented switch may include a control terminal coupled to the supply line (for example $V_{cc}$); and/or
- the second transistor-implemented switch may include a control terminal coupled to an enable input (for example EN) configured for enabling operation of the circuit; and/or
- a reference transistor (for example MR) may be provided with its current path extending between the reference node and a common node of the second transistor and the second transistor-implemented switch with the control terminal (for example gate in the case of a field-effect transistor such as a MOSFET) of the second transistor-implemented switch coupled via a logical inverter (for example 14) with the control terminal of the reference transistor.

In one or more embodiments, the third current path and the fourth current path may include a fifth transistor (for example M7) and a sixth transistor (for example M8) between the supply line and the third and the fourth transistor, respectively, the fifth transistor and the sixth transistor having their current paths in series with the current paths of the third and fourth transistor, respectively.

In one or more embodiments the output node may be coupled between the fourth transistor and the sixth transistor.

In one or more embodiments the fifth transistor and the sixth transistor may have their control terminals coupled with each other.

In one or more embodiments the fifth transistor may be arranged in a diode configuration with the control terminal coupled with the current path (for example gate shorted to drain).

One or more embodiments may include at least one inverter stage (for example 12) coupled with the output node.

In one or more embodiments, said transistors (for example M5, M6, M3, M4, M7, M8, M1, M2, MR) include field-effect transistors (that is, having source-drain current paths or channels therethrough and gate control terminals), such as MOSFET transistors.

In one or more embodiments, a device may include:
- a circuit according to one or more embodiments, and
- a user device (for example DC-DC converter as discussed previously, as exemplified by UD in FIGS. 3 and 5) coupled with the output node (OUT) of the circuit.

In one or more embodiments a method may include:
- providing a circuit according to one or more embodiments,
- applying a reference signal (for example $V_{REF}$) to the reference node,
- applying an input signal (for example $V_{IN}$) to the input node,
- sensing at the output node (for example OUT) a signal having first and second logical levels as a function of the signal at the input node being higher or lower than the level of the reference signal.

Without prejudice to the underlying principles, the details and embodiments may vary, even significantly, with respect to what has been described by way of example only, without departing from the extent of protection.

The extent of protection is defined by the annexed claims.

The invention claimed is:

1. A circuit, comprising:
- a first current path including a first current generator and a first transistor, the first current generator coupled between a supply line and a first node and the first transistor having a current path coupled between the first node and a reference node configured to receive a reference signal;
- a second current path including a second current generator and a second transistor, the second current generator coupled between the supply line and a second node and the second transistor having a current path coupled between the second node and an input node configured to receive an input signal;

wherein control terminals of the first transistor and the second transistor are coupled at third node;

a third current generator configured to sink a current from the third node to a ground node;

a third current path between the supply line and the third node, the third current path including a third transistor having a control terminal coupled with the first node;

a fourth current path between the supply line and the third node, the fourth current path including a fourth transistor having a control terminal coupled with the second node; and an output node coupled to the fourth current path and configured to generate an output signal switchable between a first and a second state as a result of a level of the input signal at the input node crossing a level of the reference signal at the reference node.

2. The circuit of claim 1, wherein the first transistor and the second transistor are modular transistors, with the second transistor including a number N of active modules different from a number K of active modules in the first transistor.

3. The circuit of claim 2, where N<K.

4. A circuit, comprising:
a first current path including a first current generator and a first transistor, the first current generator coupled between a supply line and a first node and the first transistor having a current path coupled between the first node and a reference node configured to receive a reference signal;

a second current path including a second current generator and a second transistor, the second current generator coupled between the supply line and a second node and the second transistor having a current path coupled between the second node and an input node configured to receive an input signal;

wherein control terminals of the first transistor and the second transistor are coupled at third node;

a third current generator active on the third node;

a third current path between the supply line and the third node, the third current path including a third transistor having a control terminal coupled with the first node;

a fourth current path between the supply line and the third node, the fourth current path including a fourth transistor having a control terminal coupled with the second node;

an output node coupled to the fourth current path and configured to generate an output signal switchable between a first and a second state as a result of a level of the input signal at the input node crossing a level of the reference signal at the reference node;

a first transistor-implemented switch coupled is series with the first transistor and configured to receive the reference signal; and a second transistor-implemented switch coupled in series with the second transistor and configured to receive the input signal.

5. The circuit of claim 4, wherein the first transistor-implemented switch and the second transistor-implemented switch are modular transistors with the second transistor-implemented switch including a number N of active modules different from a number K of active modules in the first transistor-implemented switch.

6. The circuit of claim 5, wherein N<K.

7. The circuit of claim 4, wherein the first transistor-implemented switch includes a control terminal coupled to the supply line.

8. The circuit of claim 4, wherein the second transistor-implemented switch includes a control terminal coupled to receive an enable signal configured to enable operation of the circuit.

9. The circuit of claim 8, further comprising a reference transistor having a current path coupled between the reference node and a common node connected between the second transistor and the second transistor-implemented switch, the reference transistor having a control terminal coupled to receive a logical invert of the enable signal.

10. The circuit of claim 4, further comprising a reference transistor having a current path coupled between the reference node and a common node connected between the second transistor and the second transistor-implemented switch, the reference transistor having a control terminal coupled to receive a disable signal configured to disable operation of the circuit.

11. The circuit of claim 4, further comprising:
a fifth transistor in the third current path coupled in series with the third transistor; and
a sixth transistor in the fourth current path coupled in series with the fourth transistor.

12. The circuit of claim 11, wherein the output node is coupled between the fourth transistor and the sixth transistor.

13. The circuit of claim 11, wherein the fifth transistor and the sixth transistor have control terminals coupled together.

14. The circuit of claim 13, wherein the fifth transistor is arranged in a diode configuration.

15. The circuit of claim 13, wherein the fifth and sixth transistors are connected to form a current mirror circuit.

16. The circuit of claim 4, further comprising at least one inverter stage having an input coupled to receive the output signal from the output node.

17. The circuit of claim 4, further comprising a user device coupled to receive the output signal from the output node.

18. The circuit of claim 17, wherein the user device is a DC-DC converter circuit.

19. A comparator circuit, comprising:
a first current source configured to source a first current to a first node;
a second current source configured to source a second current to a second node;
a first input transistor having a source-drain path coupled between the first node and a first input node;
a second input transistor having a source-drain path coupled between the second node and a second input node;
wherein control terminals of the first input transistor and the second input transistor are coupled at third node;
a third current generator configured to sink a third current from the third node to a ground node;
a current mirror circuit;
a third transistor having a source-drain path coupled between the current mirror circuit and the third node, a control terminal of the third transistor coupled to the first node; and
a fourth transistor having a source-drain path coupled between the current mirror circuit and the third node, a control terminal of the fourth transistor coupled to the second node.

20. The circuit of claim 19, wherein the first and second currents have a same magnitude.

21. The circuit of claim 19, further comprising an output node coupled between the fourth transistor and the current mirror circuit.

22. The circuit of claim 19, wherein the first input transistor and the second input transistor are modular transistors, with the second input transistor including a number N of active modules different from a number K of active modules in the first input transistor.

23. The circuit of claim 22, where N<K.

24. A circuit, comprising:
a first current source configured to source a first current to a first node;
a second current source configured to source a second current to a second node;
a first input transistor having a source-drain path coupled between the first node and a first input node;
a second input transistor having a source-drain path coupled between the second node and a second input node;
wherein control terminals of the first input transistor and the second input transistor are coupled at third node;
a third current generator configured to sink a third current from the third node;
a current mirror circuit;
a third transistor having a source-drain path coupled between the current mirror circuit and the third node, a control terminal of the third transistor coupled to the first node; and
a fourth transistor having a source-drain path coupled between the current mirror circuit and the third node, a control terminal of the fourth transistor coupled to the second node;
a first switch transistor having a current path coupled between the source-drain path of the first input transistor and the first input node; and
a second switch transistor having a current path coupled between the source-drain path of the second input transistor and the second input node.

25. The circuit of claim 24, wherein the first switch transistor is controlled to be closed and the second switch transistor is controlled to be closed in response to an enable signal.

26. The circuit of claim 25, further comprising a third switch transistor having a current path coupled between the source-drain path of the second input transistor and the first input node, wherein the third switch transistor is controlled to be closed in response to an invert of the enable signal.

27. The circuit of claim 24, further comprising an output node coupled between the fourth transistor and the current mirror circuit.

28. The circuit of claim 24, wherein the first input transistor and the second input transistor are modular transistors, with the second input transistor including a number N of active modules different from a number K of active modules in the first input transistor.

29. The circuit of claim 28, where N<K.

30. The circuit of claim 1, further comprising:
a fifth transistor in the third current path coupled in series with the third transistor; and
a sixth transistor in the fourth current path coupled in series with the fourth transistor.

31. The circuit of claim 30, wherein the output node is coupled between the fourth transistor and the sixth transistor.

32. The circuit of claim 30, wherein the fifth transistor and the sixth transistor have control terminals coupled together.

33. The circuit of claim 32, wherein the fifth transistor is arranged in a diode configuration.

34. The circuit of claim 32, wherein the fifth and sixth transistors are connected to form a current mirror circuit.

35. The circuit of claim 1, further comprising at least one inverter stage having an input coupled to receive the output signal from the output node.

36. The circuit of claim 1, further comprising a user device coupled to receive the output signal from the output node.

37. The circuit of claim 36, wherein the user device is a DC-DC converter circuit.

* * * * *